United States Patent [19]

Chamuel

[11] Patent Number: 4,688,076
[45] Date of Patent: Aug. 18, 1987

[54] NOISE REDUCING HEAT SINK FOR SEMICONDUCTOR LASER DIODES

[75] Inventor: Jacques R. Chamuel, Framingham, Mass.

[73] Assignee: The Charles Stark Draper Laboratory, Inc., Cambridge, Mass.

[21] Appl. No.: 847,125

[22] Filed: Apr. 1, 1986

Related U.S. Application Data

[63] Continuation of Ser. No. 487,603, Apr. 22, 1983, abandoned.

[51] Int. Cl.[4] ..................... H01L 23/36; H01L 23/40
[52] U.S. Cl. ............................................ 357/81; 357/68
[58] Field of Search ............... 372/36 HS; 357/19, 83, 357/68, 81, 17, 71

[56] References Cited

U.S. PATENT DOCUMENTS

| | | | |
|---|---|---|---|
| 3,377,524 | 4/1968 | Bock et al. | 357/81 |
| 3,396,361 | 8/1968 | Sussman | 357/81 |
| 3,462,605 | 8/1969 | Engeller | 357/19 |
| 3,946,334 | 3/1976 | Yonezu et al. | 357/71 |
| 4,095,116 | 6/1978 | Felkel et al. | 357/19 |
| 4,450,461 | 5/1984 | Cook et al. | 357/19 |
| 4,581,629 | 4/1986 | Harvey et al. | 357/81 |
| 4,582,954 | 4/1986 | Eaton et al. | 357/81 |
| 4,584,688 | 4/1986 | Demeuré et al. | 357/81 |

FOREIGN PATENT DOCUMENTS 0007989  1/1982  Japan ..................... 372/36

OTHER PUBLICATIONS

Hutchins, "Copper Mesa Heat Sink for Heteojuction Lasers",-IBM Technical Disclosure Bulletin-vol. 17, No. 1, 6-1974, p. 282.

*Primary Examiner*—Andrew J. James
*Assistant Examiner*—S. V. Clark
*Attorney, Agent, or Firm*—Weingarten, Schurgin, Gagnebin & Hayes

[57] ABSTRACT

A heat sink for optical elements such as semiconductor laser diodes which avoids focussed reflection back to the optical element of stress waves generated within the heat sink by excitation of the elements. The avoidance of this focussed reflection enhances optical performance of such elements and in particular improves the purity of the lasing spectra of semiconductor laser diodes. The heat sink is dimensioned and provided with surface contours to reflect elastic waves in a pattern to avoid focussing the waves at the optical element thus minimizing the disturbance in operation of the element induced by the concentration of focussed stress waves. The element may be mounted off center on the heat sink at a position which avoids concentrations of stress waves. A coating is optionally applied to appropriate heat sink surfaces to dampen the stress waves incident at those surfaces and thus attenuate reflection with the result of reduced disturbance of the optical element. A photodetector body is similarly structured to avoid stress or thermoelastic wave effects.

33 Claims, 3 Drawing Figures

NOISE REDUCING HEAT SINK FOR SEMICONDUCTOR LASER DIODES

This application is a continuation of application Ser. No. 487,603, filed Apr. 22, 1983 now aband.

FIELD OF THE INVENTION

This invention relates to heat sinks on which pulse activated elements are mounted and more particularly to means for reducing the incidence of focussed reflected elastic waves on the pulsed elements.

BACKGROUND OF THE INVENTION

Pulse activated elements such as laser diodes are typically mounted on a body of heat conductive material to facilitate cooling of the element. Changes in current in the pulsed element generates a thermal oscillation which translates inot a dimensional oscillation within the element. This dimensional oscillation is coupled to the body of heat conductive material on which the pulse activated element is mounted as an elastic wave or vibration. The reflection of elastic waves off body surfaces and incidence of these waves on the pulsed element results in undesirable modulations of the element characteristics.

It is desirable in both commercial and military applications and particularly in fiber optic systems, that pulsed semiconductor laser diodes emit a single frequency spectrum. The modulation of laser diode characteristics due to reflected elastic waves are manifest as changes in the refractive index and optical path length of the diode crystal. The consequence of this modulation is the introduction of undesirable spectral components into the emitted lasing spectra.

SUMMARY OF THE INVENTION

In accordance with the teachings of this invention a technique is shown for avoiding disturbance of pulse activated elements that must be heat sunk by suppressing the focussed reflection of elastic waves induced in the heat sink by pulse activation of the element.

Elastic wave reflecting surfaces of the heat sink are dimensioned and contoured such that the elastic waves induced by the pulse activation of the element are reflected in a nonfocussing pattern that avoids concentration of the waves at the element upon reflection from these surfaces. This effect is achieved in one example by contouring the heat sink surfaces irregularly so as to scatter incident elastic waves.

The reflections of elastic waves upon impingement with heat sink body surfaces may be dampened by coating the heat sink surfaces with a layer of a vibration dampening material. Upon incidence of elastic waves on the coated heat sink surface, the waves are absorbed by the dampening material thereby suppressing reflection back to the pulse activated element and consequent disturbance of the element characteristics.

The element may also be mounted off center on the surface of the heat sink body to avoid location at a point of concentrated focussed elastic waves.

To avoid surface wave reflections, the heat sink may be contoured such that corners and edges are rounded to avoid reflection of surface elastic waves from the edges of the body to a point of concentration at the element.

BRIEF DESCRIPTION OF THE DRAWINGS

These and other features of the invention are more fully set forth in the solely exemplary, detailed description and accompanying drawings of which.

DETAILED DESCRIPTION OF THE INVENTION

The present invention contemplates the avoidance of spectral disturbances in the emission of pulse or CW activated elements such as semiconductor laser diodes by reducing modulation of the activated element caused by focussed reflection of elastic or stress waves from the surfaces of heat sinks used to cool the elements. Elastic and stress waves, as such terms are used interchangeably herein, refer to mechanical waves in which the wave disturbance is in the form of a change to some property of an elastic material, such as a change in material pressure or density. More specifically, two techniques are described which accomplish this objective. The appropriate heat sink body surfaces are contoured and textured to minimize the focussed reflection of elastic waves upon the pulse activated element. The appropriate heat sink body surface are optionally coated with a vibration dampening material to absorb waves incident at the body surfaces and thereby attenuate the magnitude of wave reflection back to the pulse activated element. Also with photodetectors, thermoelastic wave generation due to the light intensity modulation may create similar error sources especially since the modulation is taking place at the frequency of the signal to be detected, and since the photodetector may have piezoelectric properties.

Also with photodetectors, thermoelastic wave generation due to the light intensity modulation may create similar error sources especially since the modulation is taking palce at the frequency of the signal to be detected, and since the photodetector may have piezoelectric properties.

Figure 1:
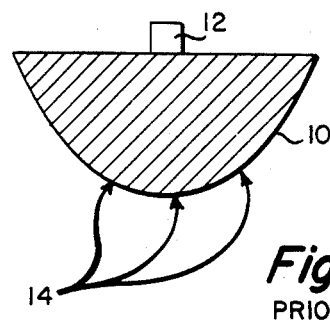
FIG. 1 is a cross-sectional view of a typical prior art heat sink body with a pulse activated element mounted thereon.

A typical art heat sink body upon which pulse activated elements are mounted is illustrated in FIG. 1. FIG. 1 shows a body of heat sink material 10 having a pulse activated element 12, such as a semiconductor laser diode, mounted thereon in close physical contact to facilitate cooling of the element 12. The pulse activated element 12 may be a Gallium Arsenide laser diode or a laser diode element of any other suitable material. The activation of the pulsed element 12 causes thermal oscillation within the element. It has been discovered that the thermal oscillation produces dimensional oscillations of the element 12 which are coupled from the pulsed element 12 to the heat sink body 10 through the close physical contact. The dimensional oscillations or vibrations traverse the heat sink body 10 as elastic waves and impinge on the peripheral heat sink surfaces 14. The elastic waves are reflected off the peripheral heat sink surfaces 14 in a focussing pattern such that reflected elastic waves are concentrated back on the pulse activated element 12. The incidence of the reflected elastic waves on the pulsed element 12 disturbs the optical characteristics of the element 12, resulting in the emission of undesirable spectral components. A.C. fluctuations in other forms of electrical excitation (transients or thermal noise) can cause similar disturbances.

Figure 2:
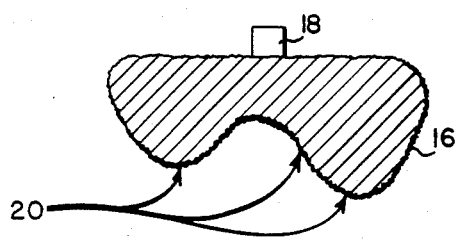
FIG. 2 is a cross-sectional view of a heat sink body according to the invention with irregular body surfaces having a pulse activated element mounted thereon.

A heat sink body that reduces focussed elastic wave reflection by scattering of elastic waves incident on peripheral heat sink surfaces is illustrated in FIG. 2. As can be seen in FIG. 2 appropriate surfaces 20 of the heat sink body 16 which is typically fabricated of metal are oriented, contoured, and textured so as to avoid focussed reflection of elastic waves back upon the pulsed element resulting in modulation of the opticl characteristics of the element and the introduction of undesirable spectral components. In particular, the heat sink body 16 is provided with an irregular shape or contour which irregularly diverts elastic waves and is further provided with nonsmooth surfaces to scatter the incident elastic waves; all thereby avoiding focussed reflection of the elastic waves back to the pulsed element or photodetector 18. The scattering of elastic waves off peripheral heat sink surfaces 20 to produce non-focussed reflections attenuates the disturbance of the pulsed element 18 emission spectra due to reflected elastic waves by reducing the magnitude of the incident reflected waves on the element 18. In the case of a photodetector, the entire body 16 may be a photosensor.

Figure 5A:
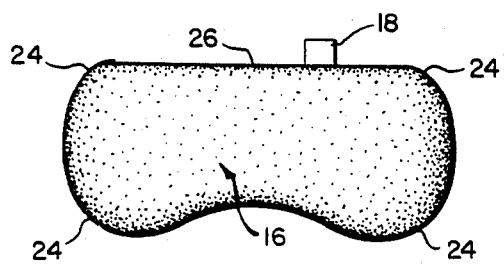
FIG. 5A is a side view of the heat sink body showing rounded corners and edges of the body.
Figure 5B:
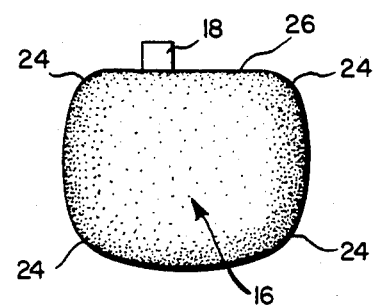
FIG. 5B is an end view of the heat sink body showing rounded corners and edges of the body.

In one heat sink body embodiment focussed reflection of surface elastic waves upon the pulse activated element is avoided by rounding all edges and corners of the heat sink body 16 as shown in heat sink side view FIGS. 5A and end view 5B. Surface elastic waves incident upon the gently rounded edges 24 are dispersed and scattered in a non-focussing pattern to minimize reflection of the elastic waves from the edges 24 of the heat sink body 16 to a focus at the pulsed element 18.

Figure 4:
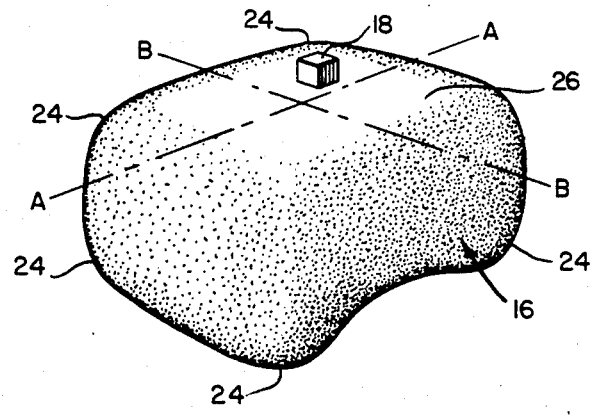
FIG. 4 is a perspective view of a heat sink body in accordance with the invention illustrating off center mounting of the pulse activated element.

In another embodiment shown in FIG. 4 the pulsed element 18 is mounted to the heat sink body mounting surface 26 in an off center location to further minimize concentration of reflected elastic waves in a heat sink body 16 at the element location.

Figure 3:
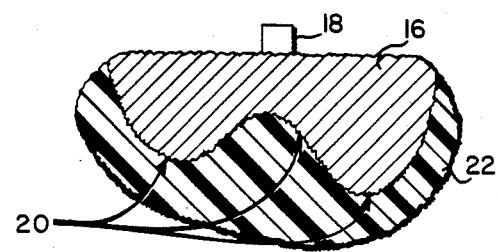
FIG. 3 is a cross-sectional view illustrating the addition of a vibration damping coating to the heat sink of FIG. 2.

The incidence of focused reflected waves upon the pulsed element 18 is also avoided by applying a vibration damping coating 22 to reflecting heat sink surfaces 20 as is illustrated in FIG. 3. Elastic waves induced in the heat sink body 16 via the mechanism described above, impinge on the body surfaces 20 and are absorbed by the vibration damping coating 22 thereby attenuating reflections back to the pulsed element 18 and thus avoiding modulation of the optical characteristics of the pulsed element 18. The vibartion damping coating 22 is typically an elastomer, an elastomer impregnated with a metal powder, a metal powder doped epoxy, or any suitable damping material known in the art.

As is apparent from FIG. 3 a preferred embodiment envisions use of a vibration damping coating 22 in combination with a heat sink body having irregularly contoured and textured surfaces 20 to achieve maximum attenuation and minimum focussed reflection of elastic waves back to the pulsed element 18.

The above described heat sink is exemplary of a device applicable for use with pulse or CW activated elements. Other modifications embodiments and departures are possible without departing from the inventive concepts contained herein. Consequently, the invention is to be construed as embracing each and every novel feature and novel combination of features present in, or possessed by the apparatus and techniques herein disclosed, and are limited solely by the scope and spirit of the appended claims.

What is claimed is:

1. A nose reducing heat sink for an electrically activated element of a type which produces stress waves upon electrical activation of said element comprising:
    a heat conductive material having a first surface and a mounting location on said first surface for mounting said electrically activated element to said heat conductive material;
    said heat conductive material having other surfaces in addition to said first surface, and wherein all said other surfaces have means for irregularly diverting said stress waves produced by said electrical element and means for scattering said stress waves incident thereon, thereby avoiding focussed reflection of said stress waves at said mounting location on said first surface.

2. The noise reducing heat sink as recited in claim 1 further including means associated with all said other surfaces comprising edges and corners associated with all said other surfaces contoured to avoid focussed reflection of said stress waves from said edges and corners to a focus at said mounting location.

3. A noise reducing heat sink as recited in claim 1 wherein the electrically activated element is a pulsed optical element.

4. A noise reducing heat sink as recited in claim 3 wherein the pulsed optical element is a semiconductor laser diode.

5. A noise reducing heat sink as recited in claim 4 wherein the semiconductor laser diode is a Gallium Arsenide crystal.

6. The noise reducing heat sink as recited in claim 1 wherein the heat conductive material is a metal body having a high coefficient of thermal conductivity.

7. A noise reducing heat sink as recited in claim 1 wheein said mounting location on said first surface is off center.

8. The noise reducing heat sink as recited in claim 1 wherein said means for scattering said stress waves incident upon all said other surfaces comprises all said other surfaces having a scattering texture to avoid focussed reflection of said stress waves therefromto a focus at the mounting location of said element on said first surface.

9. The noise reducing heat sink as recited in claim 1 wherein said means for irregularly diverting said stress waves comprises all said other surfaces contoured in an irregular, deflecting shape and said means for scattering said stress waves coprises all said other surfaces having a scattering texture to avoid focussed reflections of said stress waves to a focus at said mounting location.

10. The noise reducing heat sink as recited in claim 1 further including means associated with all said other surfaces for dampening said stress waves at all said other surfaces to avoid focussed reflections of stress waves back to said mounting location.

11. A noise reducing heat sink as recited in claim 10 whereinthe dampening means is a vibration damping coating.

12. A noise reducing heat sink as recited in claim 11 wherein said vibration damping coating is an elastomer.

13. A noise reducing heat sink as recited in claim 12 wherein the elatomer is impregnated with a metal powder.

14. The noise reducing heat sink as recited in claim 10 wherein said dampening means includes a porous metal on all said other surfaces.

15. The noise reducing heat sink as recited in claim 1 wherein said heat conductive material is a porous metal.

16. A noise reducing heat sink as recited in claim 1 wherein said electrically activated element is a photosensor.

17. The apparatus of claim 16 wherein said means for irregularly diverting said stress waves comprises all said other surfaces contoured in an irregular, deflecting shape and said means for scattering said stress waves comprises all said other surfaces having a scattering texture thereby avoiding focussed reflections of said stress waves at said mounting location.

18. The apparatus of claim 17 further including a layer of porous metal integral with all said other surfaces.

19. The apparatus of claim 16 wherein said heat conductive material is a porous metal.

20. The apparatus of claim 16 further including a layer of dampening material disposed on all said other surfaces.

21. The apparatus of claim 20 wherein said dampening material is a layer of vibration damping material.

22. The apparatus of claim 21 wherein said damping material is an elastomer.

23. The apparatus of claim 22 wherein said elastomer is impregnated with a metal powder.

24. An apparatus for producing a pure output characteristic comprising:

an electrical element which produces stress waves upon electrical energization of said element;
a body of heat conductive material having a first surface, a mounting location on said first surface, and other surfaces;
said electrical element being mounted to said first surface at said mounting location in a manner whereby said stress waves are transmitted between said electrical element and said body; and
means associated with all said other surfaces of said body for irregularly diverting said stress waves and for scattering said stress waves, thereby avoiding focussed reflections of electrical element induced stress waves at said mounting location.

25. The apparatus of claim 24 wherein said means for irregularly diverting said stress waves comprises all said other surfaces contoured in an irregular, deflecting shape and said means for scattering said stress waves comprises all said other surfaces having a scattering texture thereby avoiding focussed reflections of said stress waves at said mounting location.

26. The apparatus of claim 25 further including a layer of porous metal integral with all said other surfaces.

27. The apparatus of claim 24 wherein said body is a heat conductive porous metal.

28. The apparatus of claim 24 further including a layer of dampening material disposed on all said other surfaces.

29. The apparatus of claim 28 wherein said dampening material is a layer of vibration damping material.

30. The apparatus of claim 29 wherein said damping material is an elastomer.

31. The apparatus of claim 30 wherein said elastomer is impregnated with a metal powder.

32. The apparatus of claim 24 wherein said electrical element is a light emitting element and said output characteristic is a frequency of spectral emission characteristic of said element.

33. The apparatus of claim 32 wherein said light emitting element is a semiconductor laser diode.

* * * * *

UNITED STATES PATENT AND TRADEMARK OFFICE
CERTIFICATE OF CORRECTION

PATENT NO. : 4,688,076
DATED : August 18, 1987
INVENTOR(S) : Jacques R. Chamuel

It is certified that error appears in the above-identified patent and that said Letters Patent is hereby corrected as shown below:

Column 1, line 10, "mounted and" should read --mounted, and--
line 20, "inot" should read --into--
line 64, "sink may" should read --sink body may--

Column 2, line 40, "surface" should read --surfaces--
line 56, "typical art" should read --typical prior art--

Column 3, line 20, "opticl" should read --optical--
line 58, "vibartion" should read --vibration--

Column 4, line 47, "wheein" should read --wherein--
line 54, "therefromto" should read --therefrom to--
line 61, "coprises" should read --comprises--

Column 5, line 2, "whereinthe" should read --wherein the--
line 8, "elatomer" should read --elastomer--

Signed and Sealed this

Eighth Day of November, 1988

Attest:

DONALD J. QUIGG

Attesting Officer

Commissioner of Patents and Trademarks